United States Patent
Yu

(10) Patent No.: US 6,524,964 B2
(45) Date of Patent: Feb. 25, 2003

(54) METHOD FOR FORMING CONTACT BY USING ARF LITHOGRAPHY

(75) Inventor: Jae-Seon Yu, Kyoungki-do (KR)

(73) Assignee: Hynix Semiconductor Inc., Kyoungki-Di (KR)

( * ) Notice: Subject to any disclaimer, the term of this patent is extended or adjusted under 35 U.S.C. 154(b) by 0 days.

(21) Appl. No.: 10/159,401

(22) Filed: May 30, 2002

(65) Prior Publication Data

US 2003/0003756 A1 Jan. 2, 2003

(30) Foreign Application Priority Data

Jun. 28, 2001 (KR) ........................................ 2001-37422

(51) Int. Cl.$^7$ ........................... H01L 21/302; G03C 5/00
(52) U.S. Cl. ....................... 438/736; 438/950; 438/952; 438/737; 438/738; 438/756; 430/311
(58) Field of Search ................................ 438/736, 737, 438/738, 756, 950, 952, 597, 789, 638, 637, 586; 430/311

(56) References Cited

U.S. PATENT DOCUMENTS

| 5,959,361 | A | * | 9/1999 | Huang et al. |
| 6,069,091 | A | * | 5/2000 | Chang et al. |
| 6,191,028 | B1 | * | 2/2001 | Huang et al. |
| 6,197,681 | B1 | * | 3/2001 | Liu et al. |
| 6,294,457 | B1 | * | 9/2001 | Liu |
| 6,361,929 | B1 | * | 3/2002 | Chung et al. |
| 6,387,798 | B1 | * | 5/2002 | Loke et al. |
| 6,387,819 | B1 | * | 5/2002 | Yu |
| 6,413,846 | B1 | * | 7/2002 | Besser et al. |
| 6,426,298 | B1 | * | 7/2002 | Chen et al. |
| 6,440,840 | B1 | * | 8/2002 | Chen |
| 2001/0000155 | A1 | * | 4/2001 | Huang et al. |
| 2002/0132491 | A1 | * | 9/2002 | Lang |

* cited by examiner

Primary Examiner—John F. Niebling
Assistant Examiner—Stanetta Isaac
(74) Attorney, Agent, or Firm—Marshall, Gerstein & Borun

(57) ABSTRACT

Disclosed is a method for forming contact by using the ArF lithography technology using a low-k dielectric sacrifice layer. The method comprises forming a layer to be etched on the semiconductor substrate, successively forming a low-k dielectric sacrifice layer and a hard mask on the etched layer, forming an anti-reflective layer and a photoresist pattern on the hard mask by using ArF lithography technology, selectively etching the anti-reflective layer and the hard mask and simultaneously removing the photoresist pattern when etching the hard mask, forming a contact hole exposing a surface of the semiconductor substrate by etching the low-k dielectric sacrifice layer and the layer by using the hard mask as a mask and removing the hard mask and the low-k dielectric sacrifice layer.

14 Claims, 4 Drawing Sheets

METHOD FOR FORMING CONTACT BY USING ARF LITHOGRAPHY

BACKGROUND

1. Technical Field

A method for fabricating semiconductor devices is disclosed which includes forming contacts using ArF lithography technology.

2. Description of the Related Art

As the integration of a semiconductor device increases, it is difficult to effectively secure a desired active open area by using a direct contact method because the alignment margin of lithography processes is reduced. To alleviate the above problem, a self alignment contact (SAC) process has been introduced using a different etching ratio of a dual insulating layer including an oxide layer and a nitride layer.

A process for fabricating a semiconductor device has been developed using lithography technology. Many believe that the future of the integration of semiconductors will depend on resolution improvement of current photolithography technology.

Generally, lithography processes are carried out with an exposing process and a developing process. Recently, lithography processes usually represent an exposing process and lithography technology is classified into optical lithography or non-optical lithography. Lithography technology is employed to form a circuit substrate of various materials on a substrate.

After a photoresist (PR), polymer is coated on a substrate, the substrate is exposed through a mask (or reticle) and photosensitivity is caused in the areas in which the PR is exposed to light. Subsequently, a developing process follows and a photoresist pattern is formed. Finally, a desired pattern can be obtained by using the photoresist pattern as a barrier in an etching process.

Since the mass-production of semiconductor devices based on DRAM began, lithography technology has been rapidly developed. Integration of the DRAM has been increased four times in a three-year period. Other memory devices followed the DRAM in two to three years. The design of the semiconductor memory device developed from 0.8 $\mu$m of 4 MB DRAM to 0.13 $\mu$m of 4 GB DRAM as non-optical lithography technology was introduced.

The resolution of a lithography process is in inverse proportion to a wavelength of a light source. A wavelength of a light source used in a "step and repeat projection system" is from 436 nm (g-line) to 365 nm (i-line). Recently, exposure equipment of a stepper or scanner type using DUV (deep ultra violet) of a wavelength of 248 nm, which is a wavelength of a KrF excimer laser, is commonly used.

The lithography technology has been developed not only with exposure equipment, such as a high numerical aperture lens of over 0.6 mm and hardware that provide apertures and alignment, but also with at a resist material, such as a resist of a chemically amplified resist type or the like. Also, tri-linear resist (TLR), bi-linear resist (BLR), top surface imaging (TSI), anti reflective coating (ARC) processes have been developed as well as phase shift mask (PSM) and optical proximity correction technologies.

Since DUV lithography technology of a wavelength of 248 nm has problems of a time delay and a base material dependency, it has been used in products of 0.18 $\mu$m design. However, in order to develop products of below 0.15 $\mu$m design, a new DUV lithography technology having a wavelength of 193 nm (ArF excimer laser) has to be developed. Even if several technologies are employed in the new DUV lithography technology to increase resolution, it is impossible to form patterns of below 0.1 $\mu$m so that a new lithography technology having a new light source has been developed. Recently, the most approached technology is an exposure equipment using a electron beam and a X-ray as a light source. In addition, an EUV (extreme ultraviolet) technology using a weak X-ray as a light source has been developed. It is still impossible to estimate which the lithography technology will be adopted as the next generation photolithography technology. It will most likely be determined within two or three years.

The initial exposure equipment is a contact printer, where a mask is directly contacted with a substrate and aligned by an operator who looks directly at the mask and the substrate with the naked eye. As the gap between the substrate and the mask is decreased, resolution can be improved and the substrate is exposed with an approach printer, such as soft contact or hard contact (below 10 $\mu$m) depending on the gap.

In the early 1970s, exposure equipment of a projection type applying an optical device using reflection or refraction of light was developed, resolution was improved and the lifetime of a mask was extended. As a result, the exposure equipment of the projection type started to be applied into the product development of large substrates.

In the mid-1970s, use of a stepper using a projection optical device began, started the development of lithography technology which contributed to mass-production of semiconductors. The stepper is an abbreviated form of "step and repeat." The exposure equipment using the stepper was implemented to improve the resolution and alignment accuracy. In the initial stepper, a reduced projection exposing method, which a ratio of the mask pattern to the substrate was 5:1 or 10:1, was designed. However, the reduced projection exposing method of 5:1 was generally employed due to limitations of the mask pattern.

A scanner of a "step and scanning" type was developed in the early 1990s, which reduced the ratio to 4:1. However, the scanner performed poorly in terms of the mask pattern, whereas the scanner as an exposure equipment was used to increase production efficiency and was applied more regularly as chip sizes decreased.

The resolution is largely related with wavelength of the light source. An initial exposure equipment using g-line (wavelength ($\lambda$)=436 nm) could implement a pattern of a 0.5 $\mu$m level and exposure equipment using i-line ($\lambda$=365 nm) could implement a pattern of a 0.3 $\mu$m level. Recently, an exposure equipment using a KrF laser ($\lambda$=248 nm) and a new resister have developed and additional processes have improved. As a result, it is possible to form a pattern of below 0.15 $\mu$m.

Now, an exposure equipment using an ArF laser ($\lambda$=193 nm) is developed to form a pattern of 0.11 $\mu$m. The DUV lithography technology has excellent resolution for the i-line and DOF, however, such technology is difficult to control. This problem can arise optically due to a short wavelength and/or a chemically due to use of a chemical amplified resister. When the wavelength becomes shorter, critical dimension (CD) variation due to a standing wave and overdeveloping by reflection light due to a difference of base phases results. The CD variation of a line width is periodically changed by interference of incident light and reflective light and is changed by a minute difference of a width of a resister or a difference of a width of a base film. A chemical amplified resist has to be employed for improving sensitivity in the DUV process. However, there are problems of PED (post exposure delay) stability, base dependency and the like with respect to the reaction mechanism.

ArF exposure technology was introduced after the KrF exposure technology. A main issue with ArF exposure technology is the development of a resister for ArF. Basically, the resister used for KrF has to be improved to be used for ArF. However, a resister with a benzene ring structure cannot be used as the ArF resister. The resister with the benzene ring structure is used as the KrF resister for the i-line to secure tolerance for dry etching. When the resister with the benzene ring structure is used as the ArF resister, since absorbency is increased in a wavelength of 193 nm, which is a wavelength of the ArF laser, light permeability is reduced so that it is impossible to expose the lower side of the resister. Accordingly, a resister, which does not have a benzene structure, secures tolerance for dry etching, has good adhesion and can be developed with 2.23% TMAH, has been developed. The ArF resisters are reported in the literature.

Resisters of a polymer type of a COMA (cycloolefin-maleic anhydride) family or an acrylate family and resisters of a mixture type, which are commercially used, have a benzene ring structure.

When the ArF lithography technology is employed, pattern transformation of a striation type in a landing plug contact (LPC) process is caused or a PR cluster or plastic deformation is cause in the SAC etching process. Also, the PR can be clustered on one side in the SAC etching process.

FIGS. 1A to 1B are the cross-sectional views showing a process for forming contact with the ArF lithography technology according to the prior art.

Referring to FIG. 1A, a layer 11 to be etched is formed on a semiconductor substrate 10 and an organic anti-reflective layer 12 is coated on the layer 11 for preventing scattered reflection in exposing process. After a photo resistor is coated on the anti-reflective layer 12, a photoresist pattern 13 is formed by using the ArF lithography technology.

The layer 11 may include an insulating layer such as BPSG (boro phospho silicate), SOG (spin on glass), field oxide layer using an oxide or a nitride layer, interlayer insulating layers and hard mask layer. In addition, the layer 11 can further include a bitline using metal, such as polysilicon, tungsten or the like, and wordline which are formed with photoresist pattern 13.

Referring to FIG. 1B, as the anti-reflective layer 12 and the layer 11 are etched by using the photoresist pattern 13 as a mask, the contact hole 14 is formed. The photoresist pattern 13 and the anti-reflective layer 12 are removed.

The anti-reflective layer 12 is etched by using an etching gas including a fluorine gas, such as a $C_xF_y$ (where, x is 1 to 5 and y is 1 to 10), $C_xH_yF_z$ (where, x, y and z are 1 to 3), $S_xF_y$ (where, x is 1 to 5 and y is 1 to 10) or the like, or a mixture gas of a metal etching gas, such as a $Cl_2$, $BCl_3$ or HBR gas, and an $O_2$ gas. When the layer 11 is one of insulating layers, the layer 11 is etched by using an etching gas including a fluorine gas, such as a $C_xF_y$ (where, x is 1 to 5 and y is 1 to 10), $C_xH_yF_z$ (where, x, y and z are 1 to 3), SxFy (where, x is 1 to 5 and y is 1 to 10) or the like. When the layer 11 is a metal layer, the etched layer is etched by a metal etching gas, such as a $Cl_2$, $BCl_3$ or HBR gas.

The photoresist pattern 13 is transformed such as 'A' in FIG. 1B by an etching gas, temperature, pressure, time, or the like so that an etching shape of the etched layer 11 is transformed.

SUMMARY OF THE DISCLOSURE

A method for forming a self alignment contact (SAC) with an ArF lithography technology using a low-k dielectric layer to prevent PR pattern transformation and loss is disclosed.

A method for forming a contact in a semiconductor device is disclosed that comprises: a) forming a layer to be etched on the semiconductor substrate; b) successively forming a low-k dielectric sacrifice layer and a hard mask on the etched layer; c) forming an anti-reflective layer and a photoresist pattern on the hard mask by using ArF lithography technology; d) selectively etching the anti-reflective layer and the hard mask and simultaneously removing the photoresist pattern when etching the hard mask; e) forming a contact hole exposing a surface of the semiconductor substrate by etching the low-k dielectric sacrifice layer and the layer by using the hard mask as a mask; and f) removing the hard mask and the low-k dielectric sacrifice layer.

BRIEF DESCRIPTION OF THE DRAWINGS

Various features of the disclosed methods will become apparent from the following description of the preferred embodiments taken in conjunction with the accompanying drawings, wherein:

FIGS. 1A to 2B are cross-sectional views illustrating a process for forming contact by using an ArF lithography technology according to the prior art; and FIGS. 2A to 2E are cross-sectional views illustrating a process for forming contact by using an ArF lithography technology according to the disclosure.

DETAILED DESCRIPTION OF THE PRESENTLY PREFERRED EMBODIMENTS

Hereinafter, a ferroelectric random access memory (FeRAM) according to the disclosure will be described in detail referring to the accompanying drawings.

FIGS. 2A to 2E are cross-sectional view illustrating a process for forming a contact in a semiconductor device.

Figure 1A:
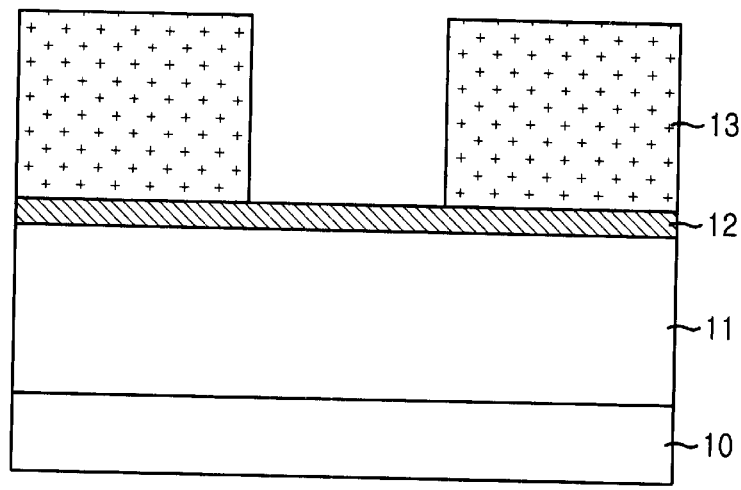
Figure 1B:
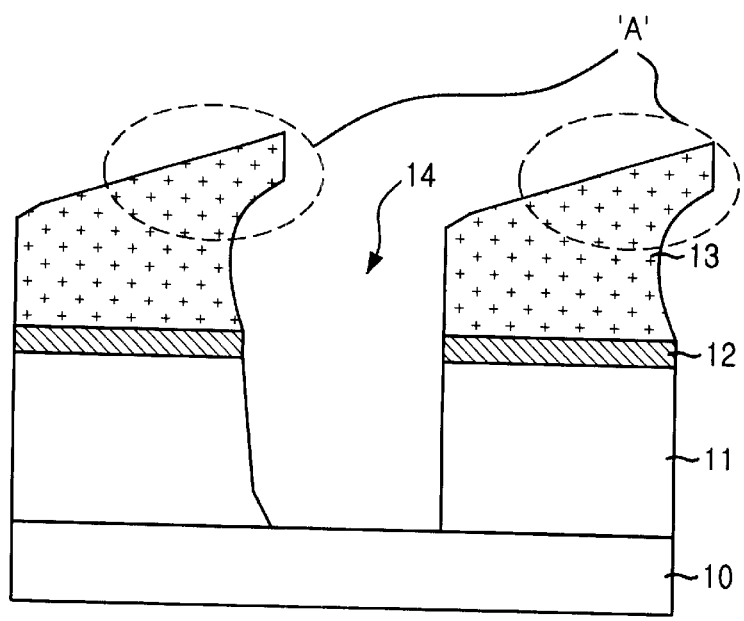
Figure 2A:
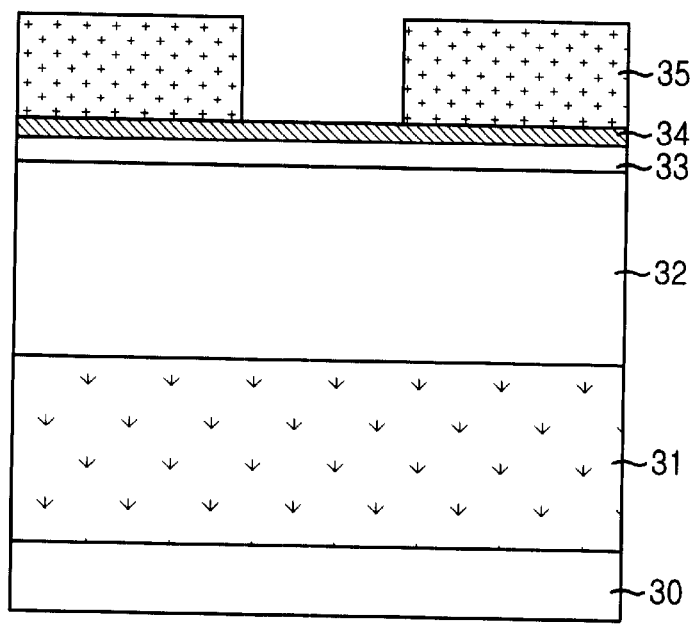

Referring to FIG. 2A, a layer 31 to be etched and a low-k dielectric sacrifice layer 32 are formed on the semiconductor substrate 30. A hard mask 33 having an organic component and an anti-reflective layer 34 are coated to prevent a scattered reflection in an exposing process. After a photoresist is overlapped on the anti-reflective layer 34, a photoresist pattern 35 is formed by using an ArF lithography technology.

The layer 31 is a general insulating layer including a BPSG (boro phospho silicate), SOG (spin on glass), field oxide layer using an oxide or nitride layer, interlayer insulating layers and hard mask layer. In addition, the etched layer 31 can further include a bitline using metal, such as polysilicon, tungsten or the like, and wordline which are formed with photoresist pattern 35. The COMA (cycloolefin-maleic anhydride) or the acrylate may be used as the photoresist.

The low-k dielectric sacrifice layer 32 is formed by an organic low-k dielectric layer, such as FLARE (trademark manufactured by AlliedSignal Inc. in U.S.), SLIK (trademark manufactured by Dow Chemical Company in U.S.), VELOX (trademark manufactured by Schumacher Co. in U.S.), BCB (benzocyclobutene), CYTOP (trademark manufactured by Asahi Glass Co., Ltd. in Japan), FLOW-FILL (trademark manufactured by PMT-Electrotech Co. in U.S.) or the like, or a SiC layer. The hard mask 33 is formed by an oxide layer at a thickness ranging from about 50 Å to about 1000 Å. The reason is as follows.

The organic low-k dielectric material is similar to the photoresist and the photoresist is etched by gases of $O_2$ family so that, when the organic low-k dielectric layer is etched, the photoresist cannot be used as the mask. At this time, an SiO$_2$ layer or an SiN layer is used as a hard mask. When the SiO$_2$ layer or the SiN layer, which is the hard mask, is etched, a photoresist is required. In addition, there is a problem that a dielectric constant of a lower layer is increased when the hard mask is formed so that the hard mask is formed by an APL (advanced planarization layer), PE-TEOS (plasma enhanced tetra ethyl ortho silicate) or SiON layer which can be formed at a relatively low temperature of below 350° C.

When the photoresist is coated, the thickness of the photoresist is below one-third (⅓) of the low-k dielectric sacrifice layer 32, that is, 0.1 μm to 0.2 μm so that the anti-reflective layer 34 and the hard mask 33 can be etched at the same time in post processes.

Figure 2B:
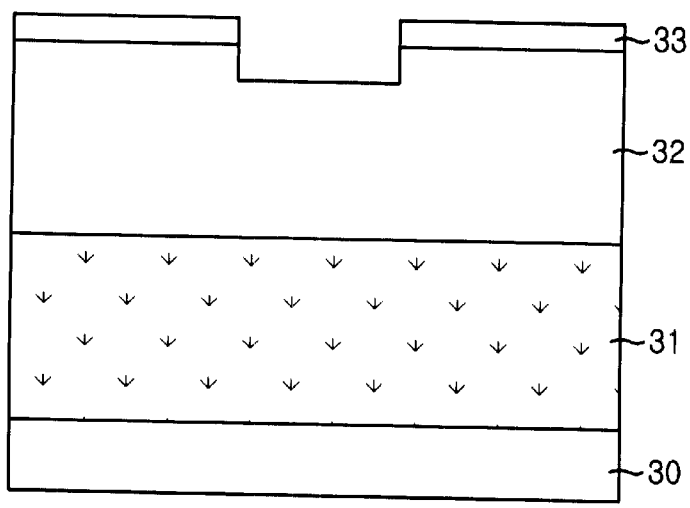

Referring to FIG. 2B, the anti-reflective layer 34 and the hard mask 33 are selectively etched by a dry etching process using a plasma and the photoresist is removed at the same time.

More concretely, the anti-reflective layer 34 is etched by using an etching gas including a fluorine gas, such as a C$_x$F$_y$ (where, x is 1 to 5 and y is 1 to 10), C$_x$H$_y$F$_z$ (where, x, y and z are 1 to 3), S$_x$F$_y$ (where, x is 1 to 5 and y is 1 to 10) or the like, or a mixture gas of a metal etching gas, such as a Cl$_2$, BCl$_3$ or HBR gas, and an O$_2$ gas and the hard mask is etched by using an etching gas including a fluorine gas, such as a C$_x$F$_y$ (where, x is 1 to 5 and y is 1 to 10), C$_x$H$_y$F$_x$ (where, x, y and z are 1 to 3), S$_x$F$_y$ (where, x is 1 to 5 and y is 1 to 10) or the like. The patterns are very sensitive for the temperature so that the temperature has to be appropriately adjusted to minimize pattern transformation and a cooling temperature of a bottom electrode in the etching equipment is adjusted at a temperature ranging from about 0° C. to about 20° C. Also, a pressure ranging from about 1 mTorr to about 30 mTorr and a bias power ranging from about 500 W to about 1400 W.

Since the photoresist is thinly coated, the photoresist nearly is removed during the etching processes of the anti-reflective layer 34 and the hard mask 33, which the etching selection ratio is lower than the photoresist, and the over etching process so that the hard mask plays role of an etching mask when the low-k dielectric sacrifice layer 32 is etched and, since the etching time is not long, minimal pattern transformation results.

Since the low-k dielectric layer, in which C and H are commonly combined, is similar to the photoresist, the same method may be applied to etching processes of them. Accordingly, when the low-k dielectric layer is etched, the hard mask of oxide layer family may be made thin and, also, the photoresist is removed when the low-k dielectric sacrifice layer 32 is etched.

As a hard baking process on a surface of photoresist pattern 35 of is performed at a temperature ranging from about 100° C. to about 250° C. before the above etching processes are carried out, it is more effective to make a hard structure.

When the low-k dielectric sacrifice layer 32 is patterned according to the ArF photoresist pattern 35, the etching slope of the low-k dielectric sacrifice layer 32 may be adjusted so that CD (critical dimension) of the mask pattern, which is formed by the etching process of the low-k dielectric sacrifice layer 32, is also appropriately adjusted. Accordingly, the etching pattern CD (critical dimension) of the layer 31 to be etched can be adjusted. The low-k dielectric sacrifice layer 32, which has similar characteristics to the photoresist, is also used for planarization of a lower layer because it is not formed by an organic deposition, but by a coating method. Accordingly, when the low-k dielectric sacrifice layer 32 is formed, poor patterns due to poor step coverage of the lower layer are prevented. When the low-k dielectric sacrifice layer 32 is patterned by the ArF photoresist pattern 35, as the etching slope of the low-k dielectric sacrifice layer 32 is appropriately adjusted, a size of the mask pattern, which is formed by the etching process of the low-k dielectric sacrifice layer 32, can be adjusted with a smaller or larger size than that of the photoresist pattern 35 so that adjustment of the pattern size, which is difficult to be implemented by an exposing or developing technology, can be easily implemented only by using the etching process.

When the layer 31, which is the layer desired to be etched, is etched, the form of the photoresist pattern has to be maintained so that the photoresist has to be thickly formed according to the prior art. On the other hand, when the photoresist is formed, a thickness of the photoresist can be thinly formed as much as the anti-reflective layer 34 and the hard mask 33 are etched so that accuracy and resolution of the pattern in the exposing and developing processes can be improved.

Figure 2C:
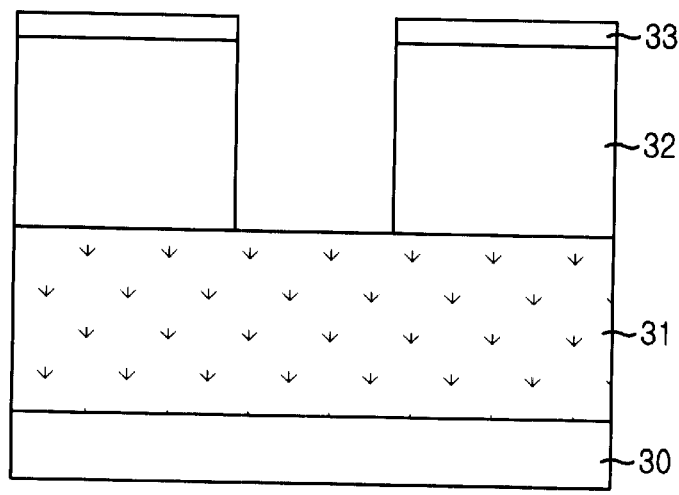

Referring to FIG. 2C, as the low-k dielectric sacrifice layer 32 is etched by using the hard mask 33, which is formed with the shape of the ArF photoresist pattern 35 by the etching process, as a mask, a surface of the etched layer 31 is exposed.

When the low-k dielectric sacrifice layer 32 is etched, a plasma etching process using an O$_2$, N$_2$O, NO, CO or SO$_2$ gas or a mixture gas thereof, which have a high etching selection ratio, is carried out. At this time, in order to improve an etching surface, an NH$_3$, N$_2$H$_2$, C$_2$H$_2$ or C$_2$H$_4$ gas is appropriately mixed. In addition, in order to adjust plasma uniformity, etching surface and etching speed, an inert gas, such as a He, Ne, Ar or Xe gas, is inserted.

Figure 2D:
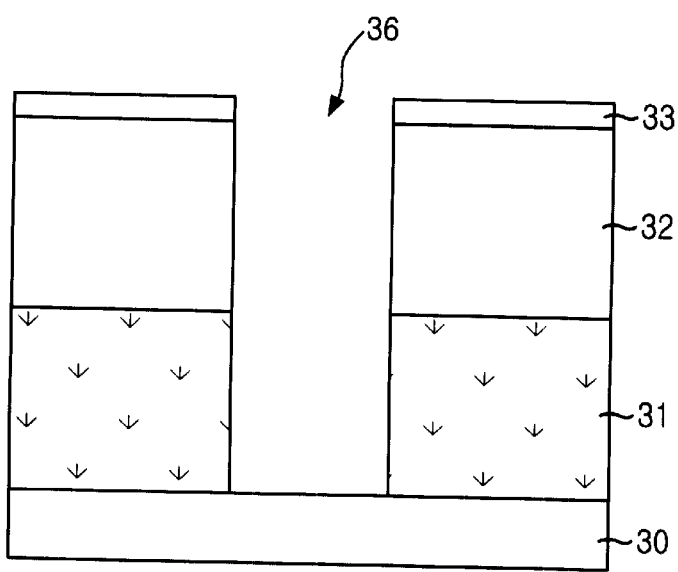

Referring to FIG. 2D, the layer 31 is etched by using the hard mask as a mask and a surface of the substrate 30 is exposed so that a contact hole 36 is formed.

Figure 2E:
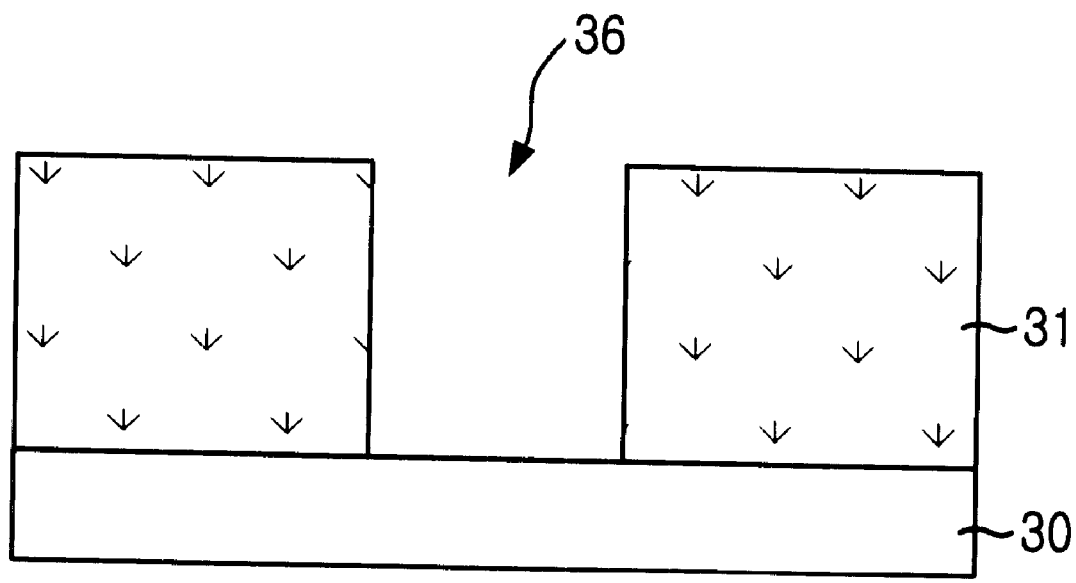

Referring to FIG. 2E, as the hard mask 33 and the low-k dielectric sacrifice layer 32 are removed, a pattern of the layer 31 can be formed by minimizing the pattern transformation.

When the low-k dielectric sacrifice layer 32 is removed, a dry etching process is employed by using an O$_2$, NO$_2$, NO, CO, CO$_2$ or SO$_2$ gas including an oxygen (O$_2$) gas. At this time, in order to improve an etching surface, an NH$_3$, N$_2$H$_2$, C$_2$H$_2$ and C$_2$H$_4$ gases may be appropriately mixed. In addition, in order to adjust plasma uniformity, etching surface and etching speed, an inert gas, such as a He, Ne, Ar or Xe gas, may be inserted. Also, a wet etching process using an etching agent including a H$_2$SO$_4$ solution, a H$_2$SO$_4$ solution and de-ionized water can be carried out.

Accordingly, as an etching tolerance by hardening a PR pattern after forming polymer on a PR pattern is improved, PR pattern transformation by the ArF lithography technology is prevented and a narrower pattern can be formed according to the disclosed methods.

While the present invention has been described with respect to the particular embodiments, it will be apparent to those skilled in the art that various changes and modifications may be made without departing from the spirit and scope of the invention as defined in the following claims.

What is claimed is:

1. A method for forming a contact in a semiconductor device comprising:
   a) forming a first layer to be etched on a semiconductor substrate;

b) successively forming a low-k dielectric sacrifice layer and a hard mask on the first layer;

c) forming an anti-reflective layer and a photoresist pattern on the hard mask using ArF lithography technology;

d) selectively etching the anti-reflective layer and the hard mask and simultaneously removing the photoresist pattern when etching the hard mask;

e) forming a contact hole exposing a surface of the semiconductor substrate by etching the low-k dielectric sacrifice layer and the first layer using the hard mask as a mask; and f) removing the hard mask and the low-k dielectric sacrifice layer.

2. The method as recited in claim 1, wherein the low-k dielectric layer is formed with a material selected from a group consisting of FLARE, VELOX, BCB, FLOWFILL, SiC and mixtures thereof.

3. The method as recited in claim 1, wherein the hard mask is formed by APL (advanced planarization layer), which is an oxide layer, PE-TEOS (plasma enhanced tetra ethyl ortho silicate) or SiON layer.

4. The method as recited in claim 1, wherein the hard mask is formed with a thickness ranging from about 50 Å to about 1000 Å.

5. The method as recited in claim 1, wherein the photoresist is formed with COMA (cycloolefin-maleic anhydride) or acrylate.

6. The method as recited in claim 1, wherein the photoresist is formed with a thickness ranging from about 0.1 $\mu$m to about 0.2 $\mu$m.

7. The method as recited in claim 1, wherein the anti-reflective layer of step d) is etched by a plasma dry etching process using at least one gas selected from a group consisting of a $C_xF_y$ (where, x is 1 to 5 and y is 1 to 10), $C_xH_yF_z$ (where, x, y and z are 1 to 3), and $S_xF_y$ (where, x is 1 to 5 and y is 1 to 10) and mixtures thereof, metal etching gas selected from the group consisting of a $Cl_2$, $BCl_3$, HBR and mixtures thereof and an $O_2$.

8. The method as recited in claim 7, wherein the hard mask of step d) is etched by a plasma dry etching process using at least one gas selected from a group of $C_xF_y$, $C_xH_yF_z$, $S_xF_y$ and mixtures thereof.

9. The method as recited in claim 8, wherein an etching equipment for etching the anti-reflective layer and the hard mask is maintained at a cooling temperature ranging from about 0° C. to about 20° C., at a pressure ranging from about 1 mTorr to about 30 mTorr and at a bias power ranging from about 500 W to about 1400 W.

10. The method as recited in claim 1, further comprising a step of performing a hard baking process of the photoresist pattern after the step c).

11. The method as recited in claim 10, wherein the hard baking process is performed at a temperature ranging from about 100° C. to about 250° C.

12. The method as recited in claim 1, wherein the etching process and the removing process of the low-k dielectric sacrifice layer at the steps e) and f) are performed by a plasma dry etching process using a main gas including at least one gas selected from a group consisting of an $O_2$, $N_2O$, NO, CO and $SO_2$ and additional $O_2$ gas.

13. The method as recited in claim 12, wherein the main gas further includes at least one gas selected from $NH_3$, $N_2H_2$, $C_2H_2$, $C_2H_4$, $N_2$, He, Ne, Ar and Xe.

14. The method as recited in claim 1, wherein the low-k dielectric sacrifice layer of step f) is removed by a wet etching process using an etching agent comprising $H_2SO_4$, $H_2O_2$ and de-ionized water.

* * * * *